US006456532B1

(12) United States Patent
Ohmi et al.

(10) Patent No.: US 6,456,532 B1
(45) Date of Patent: Sep. 24, 2002

(54) SEMICONDUCTOR MEMORY DEVICE

(75) Inventors: Tadahiro Ohmi, Miyagi-ken (JP);
Tadashi Shibata, Tokyo (JP); Keng Hoong Wee, Sherangoon Central (SG);
Takemi Yonezawa, Miyagi-ken (JP);
Toshiyuki Nozawa, Miyagi-ken (JP);
Takahisa Nitta, Tokyo (JP)

(73) Assignees: Tadahiro Ohmi, Miyagi-ken (JP);
Tadashi Shibata, Tokyo (JP); UCT Corporation, Tokyo (JP); I & F Inc., Tokyo (JP)

( * ) Notice: Subject to any disclaimer, the term of this patent is extended or adjusted under 35 U.S.C. 154(b) by 0 days.

(21) Appl. No.: 09/673,546
(22) PCT Filed: Apr. 19, 1999
(86) PCT No.: PCT/JP99/02061
§ 371 (c)(1),
(2), (4) Date: Feb. 7, 2001
(87) PCT Pub. No.: WO99/54882
PCT Pub. Date: Oct. 28, 1999

(30) Foreign Application Priority Data

Apr. 17, 1998 (JP) .............................. 10-124288

(51) Int. Cl.⁷ .............................................. G11C 16/06
(52) U.S. Cl. ........................... 365/185.21; 365/185.03; 365/185.24
(58) Field of Search ....................... 365/185.21, 185.03, 365/185.18, 185.24

(56) References Cited

U.S. PATENT DOCUMENTS 6,016,272 A * 1/2000 Gerna et al. ............ 365/185.21
6,111,791 A * 8/2000 Ghilardelli ............. 365/185.28
6,154,392 A * 11/2000 Patti ...................... 365/185.28

FOREIGN PATENT DOCUMENTS

| JP | 9-091980 | 4/1997 | .......... G11C/16/06 |
| JP | 9-180490 | 7/1997 | .......... G11C/16/04 |

OTHER PUBLICATIONS

Form PCT/IPEA/409 Cover Sheet, Box I, and Box V (total of 3 sheets).

* cited by examiner

Primary Examiner—Son Mai
(74) Attorney, Agent, or Firm—Randall J. Knuth

(57) ABSTRACT

The present invention is intended to provide a semiconductor memory circuit that can store analog and many-valued data at high speed and with a high degree of accuracy. The semiconductor memory circuit comprises a memory cell in which analog and many-valued signals can be written and stored, a readout circuit having an output terminal which outputs the values stored in the memory cell to the outside as voltages, a comparator having an output terminal which outputs a write end signal when the output terminal voltage of the readout circuit equals to a predetermined voltage, a write voltage controlling circuit having an output terminal which outputs an output voltage corresponding to the analog and many-valued voltage values inputted to an input terminal as a writing voltage of the memory cell, and a write voltage switching circuit having a function which supplies the output voltage of the write voltage controlling circuit to the memory cell and stops to supply the output voltage of the write voltage controlling circuit to the memory cell when the write end signal is outputted to the output terminal of the comparator.

17 Claims, 4 Drawing Sheets

SEMICONDUCTOR MEMORY DEVICE

BACKGROUND OF THE INVENTION

1. Field of the Invention

The present invention relates to a semiconductor memory circuit and, more particularly, to a semiconductor memory circuit that can store analog and many-valued data at high speed and with a high degree of accuracy.

2. Description of the Related Art

The inventors of the present invention developed an analog and many-valued semiconductor memory device utilizing a MOS transistor with a floating gate (Japanese Patent Application No. Hei 9-24063).

After carrying out the study in order to improve the semiconductor memory device and achieve higher integration and quick, accurate writing and reading characteristics, we found that the semiconductor memory device included some following problems. The present invention has been completed according to such teachings as:

(1) A voltage used when data are written into a memory cell, for example, a high voltage applied to a tunnel oxide film when data are written into a tunnel oxide film by flowing a Fowler-Nordheim current therethrough, uses a predetermined constant voltage independent of values which are desired to be stored in the memory cell, so that there is a limit to write data into the memory cell at high speed and with high precision.

(2) When an offset voltage that occurs in a memory cell is corrected, an offset voltage of a dummy cell different from the memory cell into which data are written is detected, and by using the voltage value detected, the correction of the offset voltage of the memory cell into which data are written is performed. Accordingly, when there is any difference in manufacture between the memory cell for writing and the dummy memory cell, the effect of correction of the offset voltage is faded out, thereby causing highly accurate writing operation to be impossible.

(3) Control for correcting an offset voltage occurring in a memory cell is complicated, and also all of the voltage ranges readable from a circuit which reads out values stored in the memory cell can not be used as a range of voltage values for storing in the memory cell.

(4) Two transistors are used as a configuration of a memory cell, so that the occupied area of a memory cell on a chip becomes large, preventing high integration.

The present invention has been made in view of the above-described background, and therefore, is intended to provide a semiconductor circuit which can store analog and many-valued data quickly and accurately and further, which can be highly integrated.

SUMMARY OF THE INVENTION

The first semiconductor memory device according to the present invention comprises a memory cell in which analog and many-valued signals can be written and stored, a readout circuit having an output terminal which outputs the values stored in the memory cell to the outside as voltages, a comparator having an output terminal which outputs a write end signal when the output terminal voltage of the readout circuit equals to a predetermined voltage, a write voltage controlling circuit having an output terminal which outputs an output voltage corresponding to the analog and many-valued voltage values inputted to an input terminal as a writing voltage of the memory cell, and a write voltage switching circuit having a function which supplies the output voltage of the write voltage controlling circuit to the memory cell and stops to supply the output voltage of the write voltage controlling circuit to the memory cell when the write end signal is outputted to the output terminal of the comparator.

A writing operation is performed by producing a writing voltage corresponding to a value which is stored in the memory cell as the voltage used for writing the value to the memory cell and by supplying the writing voltage to the memory cell. As a result, the time from starting the writing operation in the memory cell to stopping the operation is substantially constant, independent of a value to be stored, thereby allowing high speed and high precision writing.

The second semiconductor memory device according to the present invention comprises a memory cell in which analog and many-valued signals can be written and stored, a readout circuit having an output terminal which outputs the values stored in the memory cell to the outside as voltages, a comparison calculation circuit having an output terminal which outputs a write end signal when the output terminal voltage of the readout circuit equals a predetermined voltage, a comparator having a means for inputting a voltage produced by adding a difference of the readout voltage of the output terminal and a standard voltage to a write target voltage to the predetermined voltage of the comparison calculation circuit, a write voltage controlling circuit having an output terminal which outputs a voltage for writing in the memory cell, and a write voltage switching circuit having a function which supplies the output voltage of the write voltage controlling circuit to the memory cell and stops to supply the output voltage of the write voltage controlling circuit to the memory cell when the write end signal is outputted to the output terminal of the comparator, and wherein writing activity is performed by executing a first writing in the memory cell by inputting the standard voltage to the predetermined voltage, and by inputting the voltage obtained by adding the difference of the readout voltage outputted on the output terminal of the readout circuit and the standard voltage to the write target voltage to the predetermined voltage of the comparison calculation circuit, immediately after the end of the first writing, as a second writing to the memory cell to which the first writing has been performed.

In this way, when an offset voltage of a memory cell is corrected, the offset voltage is detected by performing preliminary writing to the cell to be written, and by using the detected value, the offset voltage is corrected. As a result, when data are written to the memory cell, errors due to manufacturing difference can be eliminated, allowing writing activity to perform with high precision.

The third semiconductor memory device according to the present invention includes two or more memory devices, one of which comprises a floating gate in which analog and many-valued signals can be written and stored and further the analog and many-valued signals can be stored as an amount of charges, a memory cell having a control gate which performs capacitive coupling with the floating gate, a readout circuit having an output terminal which outputs the values stored in the memory cell to the outside as voltages, a comparator having an output terminal which outputs a write end signal when the output terminal voltage of the readout circuit equals to a predetermined voltage, and a write voltage controlling circuit having an output terminal which outputs a voltage for writing in the memory cell and a means for outputting, and also including a function which stops to supply the voltage for writing of the output terminal to the memory cell when the write end signal is outputted to the output terminal of the comparator, and further, comprises a differential amplifier which includes a plus input terminal and a minus input terminal and amplifies the difference of voltage values of the plus input terminal and the minus input terminal to output as a voltage, and a control gate controlling circuit which is provided with a means for connecting the output of the differential amplifier to both of the control gates of a first memory device and a second memory device, and wherein writing to the first memory device is performed by inputting a standard voltage to the predetermined voltage of the first memory device and by setting the control gate of the memory cell of the first memory device to a reference voltage, writing to the second memory device is executed by causing the control gate of the memory cell of the second memory device to be a reference voltage and by inputting a write target voltage to the predetermined voltage, and when the value stored in the memory cell of the second memory device is read out, the readout activity is performed with high precision by connecting an output of the output terminal of the readout circuit of the first memory device to the minus terminal of the differential amplifier, by connecting the standard voltage to the plus terminal of the differential amplifier, and by connecting the output of the differential amplifier to the control gates of the first and second memory devices.

In addition, the fourth semiconductor memory device according to the present invention includes two or more memory devices comprising a floating gate in which analog and many-valued signals can be written and stored and further the analog and many-valued signals can be stored as an amount of charges, a memory cell having a control gate which perform capacitive coupling with the floating gate, a readout circuit having an output terminal which outputs the values stored in the memory cell to the outside as voltages, a comparator having an output terminal which outputs a write end signal when the output terminal voltage of the readout circuit equals to a predetermined voltage, and a write voltage controlling circuit having an output terminal which outputs voltage for writing in the memory cell and a means for outputting, and also including a function which stops to supply the voltage for writing of the output terminal to the memory cell when the write end signal is outputted to the output terminal of the comparator, and further, comprises a differential amplifier which includes a plus input terminal and a minus input terminal and amplifies the difference of voltage values of the plus input terminal and the minus input terminal to output as a voltage, and a control gate controlling circuit which is provided with a means for connecting the output of the differential amplifier to both of the control gates of a first memory device and a second memory device, and wherein, after writing to the first memory device has been performed by inputting a standard voltage to the predetermined voltage of the first memory device to cause the control gate of the memory cell of the first memory device to be a reference voltage, writing activity is performed by connecting an output of the output terminal of the readout circuit of the first memory device to the minus terminal of the differential amplifier, by connecting the standard voltage to the plus terminal of the differential amplifier, by connecting the output of the differential amplifier to the control gates of the first and second memory devices, and by inputting a write target voltage to the predetermined voltage of the second memory device.

As described above, the third and fourth semiconductor memory devices according to the present invention correct the offset voltage of the memory cell by controlling the voltage of the control gate of the memory cell. As a result, writing control is simple, and also the voltage range readable from the readout circuit can be used as it is as a write target value.

The fifth semiconductor memory device according to the present invention, in a semiconductor memory device which has a plurality of memory cells including MOS transistors with floating gates, control gates performing first capacitive coupling with the floating gates, and write terminals performing second capacitive coupling with the floating gates and capable of writing and storing analog and many-valued signals, and has a readout circuit capable of writing to a selected memory cell and outputting a voltage of the floating gate of the selected memory cell to the output terminal, is characterized in that selection of the memory cell is performed by voltage control of the control gate, and in writing activity to the memory cell, the voltage of the floating gate is outputted to the output terminal using the readout circuit simultaneous with writing, and termination judgment for writing is executed based on the output voltage of the output terminal to terminate the writing activity.

The selection of a cell for writing and reading is not performed, as with the prior art, by providing with a MOS transistor and controlling the transistor, but performed by controlling the voltage of the control gate. Consequently, the MOS transistor to select a memory cell can be eliminated and the memory cell can be constituted by one MOS transistor, allowing the memory cell to be highly integrated.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

DESCRIPTION OF REFERENCE

Figure 1:
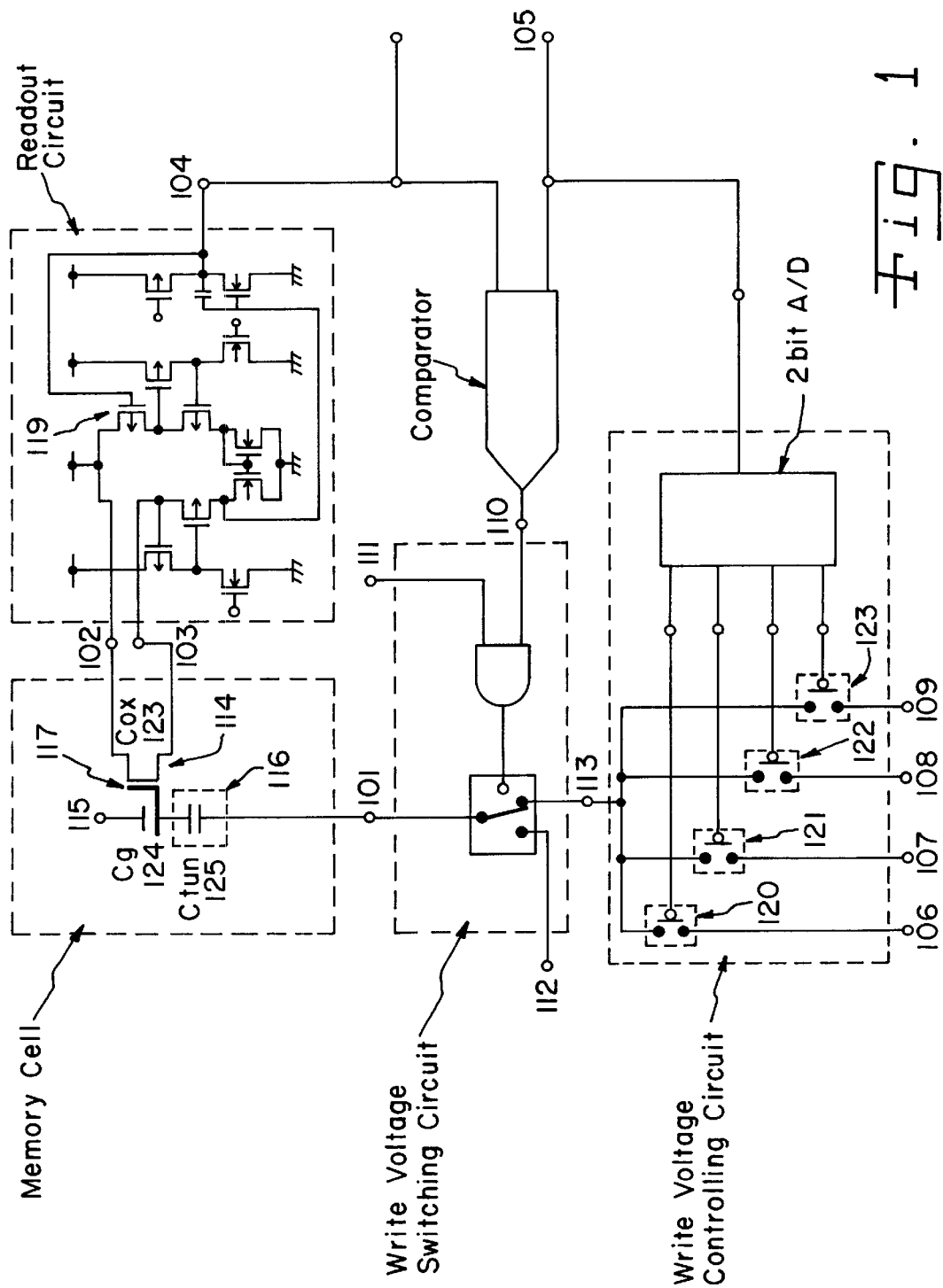
FIG. 1 is a diagrammatic representation showing a circuitry of the semiconductor memory device of the embodiment 1.

101 Output terminal of the write voltage switching circuit
104 Output terminal of the readout circuit
105 External signal input terminal
113 Output terminal of the write controlling circuit
114 MOS transistor
115 Control gate
116 Charge injecting and extracting means
117 Floating gate 119 MOS transistor
120, 121, 122, and 123 Switch
123 Capacity of gate oxide film
124 Capacity of the control gate
Capacity
301 Standard voltage input terminal
308 Write target voltage input terminal
306, 310 Output terminal of the write controlling circuit
324, 328 Control gate
330, 331 Memory cell
333, 334 Floating gate
335, 336 MOS transistor
337, 338 Charge injecting and extracting means

DETAILED DESCRIPTION OF THE INVENTION

The embodiments of the present invention will be described in more detail in conjunction with the accompanying drawings.

Embodiment 1

FIG. 1 shows a first embodiment of the present invention. The semiconductor memory device according to the present embodiment is mainly composed of a memory cell, a readout circuit, a comparator, a write voltage controlling circuit, and a write voltage switching circuit, as shown in FIG. 1.

The memory cell is composed of a MOS transistor 114 having a floating gate 117, a control gate 115 capacitively coupling with the floating gate 117, and a means 116 for injecting and extracting charges. The means 116 is connected to the floating gate 117 and an output terminal 101. In this embodiment, the floating gate 117 is connected to the output terminal 101 of the write voltage switching circuit through a thin tunnel oxide film. The charge injecting and extracting means 116 injects and extracts the charges of the floating gate 117 using a Fowler-Nordheim current by inputting a high voltage to the output terminal 101 to add the high voltage between floating gate 117 and the output terminal 101 (the tunnel oxide layer).

When a nitride layer or oxynitride layer is used in place of the oxide film, a Frankel-Pool emission current may also be used. Alternatively, when the means 116 is constituted of a MOS transistor, a gate of the transistor is connected to the floating gate 117, either a source or a drain of the transistor is connected to the output terminal 101, and the remaining source or drain is connected to the ground or a predetermined electrical potential, a Channel Hot Electron current may be used.

Further, a source and drain of the MOS transistor 114 are connected to nodes 102 and 103, respectively, which become input signals of the readout circuit.

The readout circuit is constituted of a pair of transistors of the MOS transistor 114 and a MOS transistor 119, as shown in FIG. 1, and reads out a voltage value of the floating gate 117 by operation of a voltage follower of an operational amplifier comprising the readout circuit and the transistor 114 to output the read out voltage value to an output terminal 104. The readout circuit may also read out the voltage by a source follower reading method by connecting either node 102 or 103 to the output terminal 104.

The comparator uses voltages of the output terminal 104 and an external input terminal 105 as input signals, and outputs an end signal to a terminal 110 when the voltage of the output terminal 104 read out by the readout circuit during writing of the memory cell is equal to the external input terminal 105.

An output voltage of an output terminal 113 of the write controlling circuit and, for example, the ground potential or a half of the voltage value of the output terminal 113 from a terminal 112 are inputted to the write voltage switching circuit. The write voltage switching circuit outputs the output voltage of the output terminal 113 of the write controlling circuit to the output terminal 101 of the write voltage switching circuit when both of control signals of terminals 111 and 110 are "1" and otherwise outputs the voltage of the terminal 112 to the output terminal 101.

In the write voltage controlling circuit, a two bit A/D converter, for example, converts an analog voltage inputted to the external signal input terminal 105 to a digital signal, and makes any one of switches 120, 121, 122, and 123 to be ON. For example, when a write target value employs a range of voltage values from 0.5V to 4.5V, the write voltage controlling circuit operates according to the voltage values of the external signal input terminal 105 such that, when the voltage value is in the range from 0.5V to 1.5V, the switch 120 is turned ON to output an input voltage of an terminal 106 to the output terminal 113, when the voltage value is in the range from 1.5V to 2.5V, the switch 121 is turned ON to output an input voltage of an terminal 107 to the output terminal 113, when the voltage value is in the range from 2.5V to 3.5V, the switch 122 is turned ON to output an input voltage of an terminal 108 to the output terminal 113, and when the voltage value is in the range from 3.5V to 4.5V, the switch 123 is turned ON to output an input voltage of an terminal 109 to the output terminal 113. Accordingly, the write voltage controlling circuit outputs writing voltages corresponding to the voltage values of the write target values inputted to the external input terminal 105. Alternatively, a method may be employed in which the external signal input terminal 105 is made to be an input terminal of the write voltage controlling circuit, the input signals from the terminals 107, 108, and 109 are eliminated, and the voltage of the external signal input terminal 105 is added to the input voltage of the terminal 106 and the added voltage is outputted to the output terminal 113. In addition, the write voltage controlling circuit may be constituted by a circuit having input-output characteristics between the input of the external signal input terminal 105 and the output of the output terminal 113, in which the output voltage can be described by a function of the input voltage, such as, for example, (the output voltage of the terminal 113)=square root of (the input voltage of the terminal 105)+15.0V.

(Explanation of the Operation)

The operating characteristics of the circuit in FIG. 1 will be explained. When writing to the memory cell is performed, firstly, a write target voltage is inputted to the external signal input terminal 105, and a voltage of any one of switches 106, 107, 108, and 109 is outputted to the output terminal 113 relative to the write target voltage in the write voltage controlling circuit. For example, when the voltage of the input terminal 105 is 1.2V, only the switch 120 is turned ON, causing voltage 15V of the terminal 106 to be outputted to the output terminal 113.

When the control gate 115 of the memory cell is set to a predetermined constant value such as 0V, the terminal 111 is set to "1", and the output terminal 104 of the readout circuit is not equal to the input signal terminal 105, the output of the terminal 110 is "0", so that the writing voltage of the output terminal 113 is outputted to the output terminal 101 of the write voltage switching circuit, thereby causing the writing activity to be started. During this writing activity, the voltage value of the floating gate 117 is read out by the readout circuit to be outputted to the terminal 104. The termination of writing activity to the memory cell is performed such that, when the voltage values of the terminals 104 and 105 become equal in the comparator, "0" is outputted to the terminal 110 as a write end signal, thereby the output voltage of the terminal 101 is switched from the writing voltage of the terminal 113 to a voltage occurred on the terminal 112, which voltage is used after the writing activity is terminated. In this way, the writing activity of the analog and many-valued target values can be put into practice using the writing voltages corresponding to the write target voltage values. When this semiconductor memory device is used, the writing time from start of writing to end of writing can be performed at high speed and to some degree uniformly by using the writing voltages corresponding to the write target voltage values added to the external signal input terminal 105 when writing operation to the memory cell is performed.

As described in this embodiment, in a method where, during writing operation, at the same time a voltage is written to a memory cell, the voltage is read out by a circuit and end judgment of the writing operation is performed using the voltage, there is a delay time from the voltage of the memory cell reaches to a write target value until the writing operation is actually terminated, and a value written to the memory cell during this delay time causes a writing error.

In this semiconductor memory device, the writing time is uniformized to some extent and also the optimum writing voltage is supplied by the writing target voltage, so that a writing speed just before the end of writing is made constant to some extent, even if the write target voltages are different, thereby causing dispersion of the writing errors in the writing operation to be converged within a certain range. Accordingly, a high precision writing can be realized.

Embodiment 2

Figure 2:
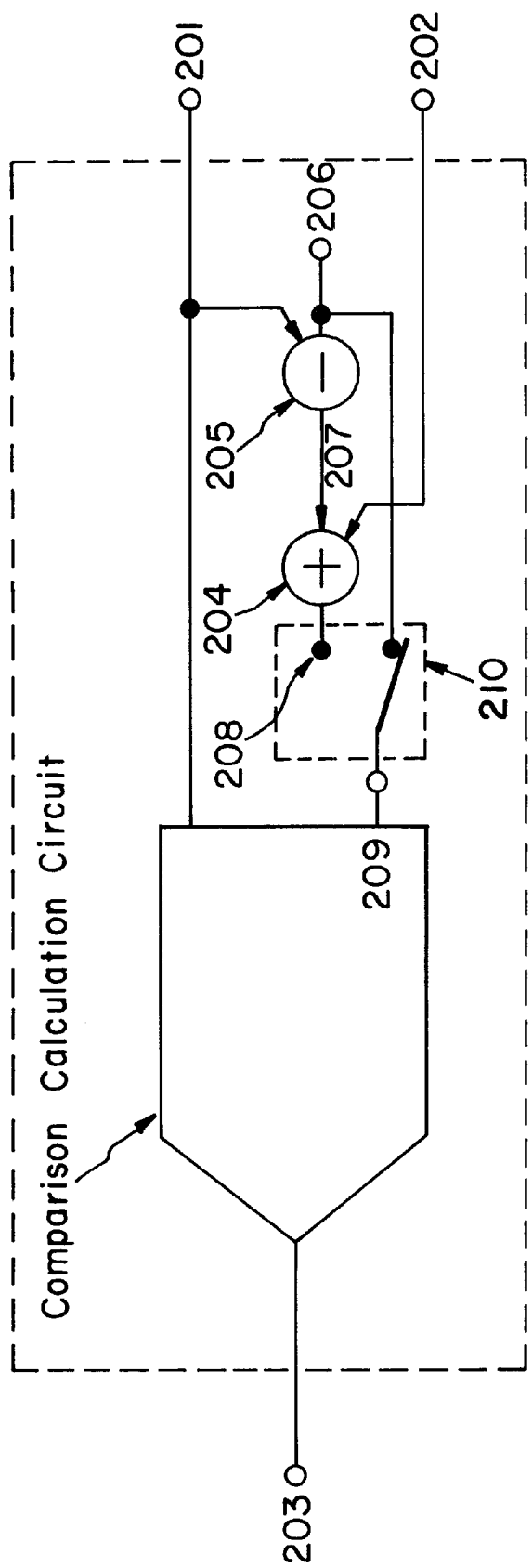
FIG. 2 is a diagrammatic representation showing a circuitry of the comparator of the embodiment 2.

FIG. 2 shows a second embodiment of the present invention. The semiconductor memory device according to the present embodiment is similar to that of the embodiment 1, except for a comparator shown in FIG. 2.

The comparator has a node 201 connected to the output terminal 104 of the readout circuit, a node 202 connected to the external input terminal 105, and a terminal 206 for inputting a predetermined standard voltage, as input terminals, and outputs a write end signal to an output terminal 203.

Although the predetermined standard voltage is used in this embodiment, a voltage of the terminal 202 may be inputted to the terminal 206. A circuit 204 outputs a voltage resulting from adding a voltage of a node 207 to a voltage of the node 202 to a terminal 208. A circuit 205 outputs a difference between voltage values of the terminal 206 and the node 201 to a node 207. The node 201 and a node 209 are input terminals of a comparison calculation circuit, which outputs a write end signal, for example, such as "0", to the output terminal 203, when voltage values of the node 201 and the node 209 become equal. The node 209 is connected to either a terminal 208 or the terminal 206 through a terminal 210.

(Explanation of the Operation)

During writing operation, the control gate 115 is kept to a predetermined constant voltage, for example 0V. Firstly, a write target voltage is inputted to the input terminal 105. The write controlling circuit outputs the writing voltage to the output terminal 113. At this point, the terminal 111 is set to "0", so that a voltage of the terminal 112 is outputted to the output terminal 101 of the write switching circuit. The voltage of the terminal 112 is set to a value which does not produce a Fowler-Nordheim current in the oxide film 116. Initially, a preliminary writing is performed by connecting the terminal 206 to the node 209 with the terminal 210 and by making the terminal 111 "1" to output the writing voltage of the terminal 113 to the terminal 101. After the preliminary writing has been performed, when the voltages of the terminals 104 and 201 become equal to the voltage of the terminal 206, the write end signal "0" is outputted to the terminal 203, and the terminal 101 is connected to a voltage of the terminal 112 which does not produce a Fowler-Nordheim current, thereby the first writing operation is concluded. After the writing operation has been performed, as the voltage value of the terminal 101 capacitively coupling to the floating gate 117 changes from the voltage value of the terminal 113 to that of the terminal 112, an offset voltage is produced in the potential of the floating gate 117, as compared with the potential when the writing operation is concluded. Next, the node 209 is connected to the node 208 using the terminal 210. Then, a voltage is inputted to the node 209, which voltage is made by adding the difference of the voltage values of the terminal 201 and the terminal 206 to the voltage of the node 202. As a result, this voltage becomes equal to a value which is made by adding the offset voltage to the write target value of the external input terminal 105.

Then, in the write voltage switching circuit, the terminal 101 is connected to the terminal 113 to perform a second writing operation. When the writing operation has been performed, the voltages of the terminals 104 and 201 become equal to those of the terminals 206 and 209, the write end signal "0" is outputted to the output terminal 203, and the terminal 101 is connected to a voltage of the terminal 112 which does not produce a Fowler-Nordheim current, thereby the second writing operation is concluded.

After the second writing operation is concluded, the voltage outputted to the terminal 104 becomes equal to the write end voltage. In the manner described above, writing and storing operations of analog and many-valued writing target values can be performed with high precision.

Embodiment 3

Figure 3:
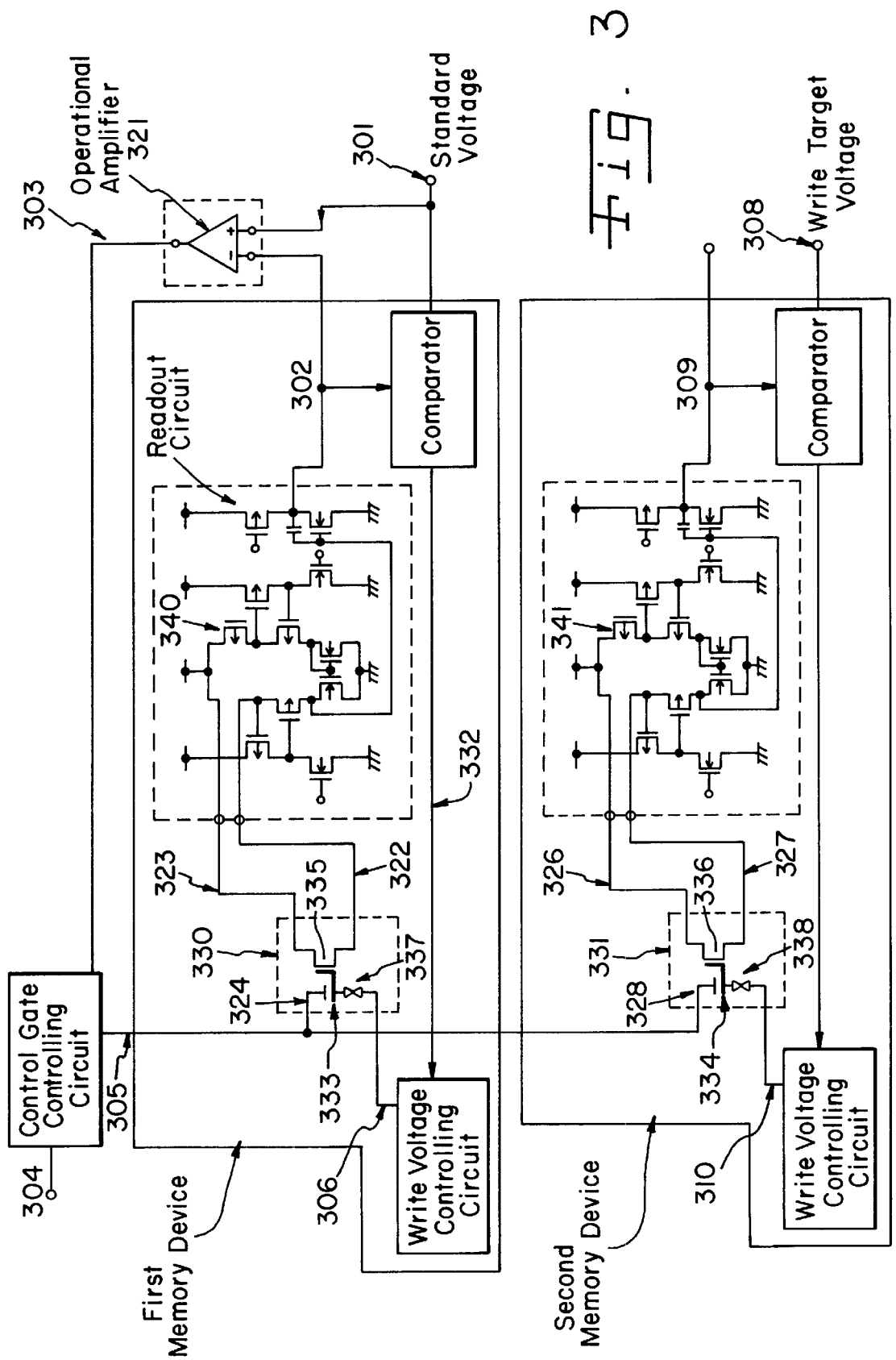
FIG. 3 is a diagrammatic representation showing a circuitry of the semiconductor memory device of the embodiment 3.

FIG. 3 shows a third embodiment according to the present invention. In this figure, a first and a second memory device are in precisely the same devices, so that only the first memory device will be explained here.

A memory cell 330 is composed of a MOS transistor 335 with a floating gate 333, a control gate 324 capacitively coupling with the floating gate 333, and a means 337 for injecting and extracting charges. The means 337 is connected to an output terminal 306 of a write voltage controlling circuit. The means 337 is formed, for example, by a thin tunnel oxide film, and charge injection and extraction are performed using a Fowler-Nordheim current in the means 337, which is produced by adding a high voltage to the means 337, which high voltage occurs as a result of inputting a high voltage to the output terminal 306. Also, when a nitride layer or oxynitride layer is used for the means 337, a Frankel-Pool emission current may be used for writing operation. Alternatively, when the means 337 is constituted of a MOS transistor, a gate of the transistor is connected to the floating gate 333, either a source or a drain of the transistor is connected to the output terminal 306, and the remaining source or drain is connected to the ground or a predetermined electrical potential, a Channel Hot Electron current may also be used. The source and drain of the transistor 335 are connected to nodes 322 and 323, respectively, to become input terminals of a readout circuit.

The readout circuit is constituted of a pair of transistors of a MOS transistor 340 and the MOS transistor 335, as shown in FIG. 3, and reads out a voltage value of the floating gate 333 by operation of a voltage follower of an operational amplifier comprising the readout circuit and the MOS transistor 335 to output the read voltage value to a node 302.

A comparator uses voltages of a node 301 and a standard voltage input terminal 302 as input signals, and outputs an end signal to a node 332 when the output voltage of the terminal 302 read out by the readout circuit during writing of the memory cell equals to the standard voltage.

A write voltage controlling circuit outputs a writing voltage to an output terminal 306, that is, it outputs the writing voltage to the terminal 306 when the write end signal has not been inputted to the node 332 and writing operation has been performed in the memory device. In other case, the write voltage controlling circuit supplies a predetermined constant voltage to the terminal 306, which does not cause a Fowler-Nordheim current to flow.

A control gate controlling circuit, during writing operation, supplies a constant voltage, such as 0V, inputted to a terminal 304 to a node 305, and during reading operation, supplies an input voltage of a node 303 to the node 305.

The standard voltage of the node 301 is inputted to a plus terminal of an operational amplifier 321 and the voltage of the node 302 is inputted to a minus terminal thereof, so that an output voltage is outputted to a node 303.

The node 305 is connected to control gates 324 and 328.

(Explanation of the Operation)

Firstly, the writing operation will be described.

In the first memory device, the writing operation is performed by inputting a standard voltage, for example, 2.0V to the terminal 301, and by adding a predetermined constant voltage of the terminal 304 to the node 305. The writing operation is performed by outputting a writing voltage to the output terminal 306 in the write voltage controlling circuit, and by injecting charges to and extracting charges from the floating gate 333 using a Fowler-Nordheim current in the means 337.

The termination of the writing operation is performed such that, when the voltage values of the nodes 302 and 301 become equal in the comparator, "0" is outputted to the node 332 as a write end signal, thereby the output voltage of the output terminal 306 in the write controlling circuit is switched from the writing voltage to a voltage used after writing operation is terminated which voltage does not allow the Fowler-Nordheim current to flow.

The writing operation of the second memory device is the same as that of the first memory device described above, and the same operation is performed by inputting analog and many-valued voltages intended to be stored in the memory cell to an external signal input terminal 308. The writing voltages of the terminals 306 and 310 during writing operation in the first and second memory devices should be equal.

After the writing operation has been performed, as the voltage value of the output terminal 306 capacitively coupling to the floating gate 333 changes from the writing voltage to the write end voltage, an offset voltage is produced in the potential of the floating gate 333, as compared with the potential when the writing operation is concluded. The same offset voltage may be produced with respect to the potential of the floating gate 334, and as the structures of the first and second memory devices are fully identical with each other, and writing operations are performed under the condition in which the writing voltage is equal to voltages of the control gates 324 and 328, the amplitude of the offset voltage of the floating gate 333 is equal to that of the floating gate 334.

Next, a readout operation of analog and many-valued voltages will be described.

When the readout operation of analog and many-valued voltages is performed, the outputs from the write voltage controlling circuits should be constant voltages, for example such as 7.0V, which do not cause the Fowler-Nordheim current to flow at the charge injecting and extracting means 337 and 338 and also the output values should be equal with each other.

During read out operation, the output of the operational amplifier 321 is connected to the node 335 in the control gate controlling circuit. By connecting in this way, in the first memory cell device, a voltage is outputted to the node 303 such that the voltage value of the node 302 becomes equal to that of the standard voltage of the terminal 301, which voltage is inputted to the nodes 305, 324, and 328 through the control gate controlling circuit. That is, the offset voltage produced in the floating gate when the writing operation is terminated is corrected by controlling the voltage of the node 324 capacitively coupling to the floating gate. It is important that, as the same voltage is applied to the nodes 324 and 328, the offset voltage of the memory cell in the second memory device is also similarly corrected so that a voltage value equal to the analog and many-valued voltages intended to be stored to the memory cell is outputted to the node 309.

In this way, the semiconductor memory devices according to the present embodiment can realize high precision writing and reading operations of analog and many-valued data to the second memory cell, using the first memory cell, the operational amplifier, and the control gate controlling circuit.

Embodiment 4

Next, a fourth embodiment according to the present invention will be explained. The semiconductor memory devices of this embodiment are the same as those of the embodiment 3.

(Explanation of the Operation)

Firstly, writing operation will be described.

In the first memory device, the writing operation is performed by inputting a standard voltage, for example, 2.0V to the standard voltage input terminal 301, and by adding a predetermined constant voltage of the terminal 304 to the node 305. The writing operation is performed by outputting a writing voltage to the output terminal 306 in the write voltage controlling circuit, and by injecting charges to and extracting charges from the floating gate 333 using a Fowler-Nordheim current in the charge injecting and extracting means 337. The termination of the writing operation is performed such that, when the voltage values of the nodes 302 and 301 become equal in the comparator, "0" is outputted to the node 332 as a write end signal, thereby the output voltage of the output terminal 306 in the write controlling circuit is switched from the writing voltage to a voltage used after writing operation is terminated which voltage does not allow the Fowler-Nordheim current to flow.

In the writing operation of the second memory device, the output voltage of the node 303 of the operational amplifier 321 is connected to the node 305 of the control gate controlling circuit. By connecting in this way, in the first memory cell device, a voltage is outputted to the node 303 such that the voltage value of the node 302 becomes equal to that of the standard voltage of the terminal 301, which voltage is inputted to the nodes 305, 324, and 328 through the control gate controlling circuit.

That is, the offset voltage produced in the floating gate when the writing operation is terminated is corrected by controlling the voltage of the node 324 capacitively coupling to the floating gate. Then, the writing operation of the second memory cell is performed similarly to that of the first memory cell by inputting analog and many-valued voltages intended to be stored in the memory cell to an external signal input terminal 308. In this case, the writing voltages of the terminals 306 and 310 during writing operation in the first and second memory devices should be equal. As the voltage value of the output terminal 310 capacitively coupling to the floating gate 334 changes from the writing voltage to the write end voltage, an offset voltage is produced in the potential of the floating gate 334 of the memory cell of the second memory device, as compared with the potential when the writing operation is concluded.

Then, the offset voltage in the potential of the floating gate 334 capacitively coupling to the node 305 is corrected by switching the output voltage of the node 305 in the control gate controlling circuit from the output voltage of the node 303 of the operational amplifier to the reference voltage of the terminal 304, thereby causing the potential of the floating gate 334 to become a voltage value intended to be stored to the memory cell.

Accordingly, the voltage of the nodes 305 and 328 is caused to be the reference voltage during the reading operation and the output voltage of the output terminal 310 of the write voltage controlling circuit is made a predetermined constant voltage, so that the stored analog and many-valued voltage can be outputted to the node 309.

Embodiment 5

Figure 4:
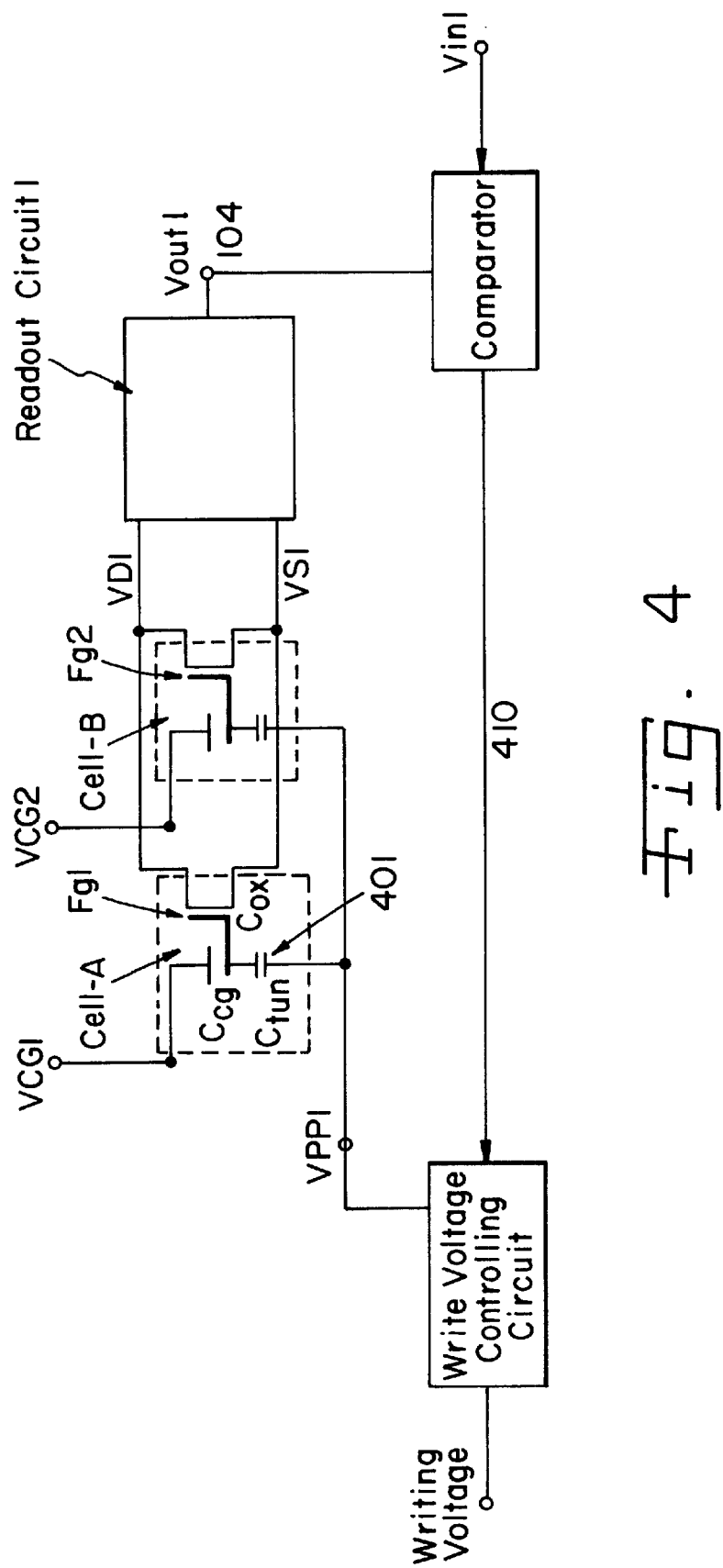
FIG. 4 is a diagrammatic representation showing a circuitry of the semiconductor memory device of the embodiment 5.

FIG. 4 shows a fifth embodiment according to the present invention. Each of Cell-A and Cell-B in the figure is a memory cell with the same structure, and voltage values of floating gates Fg1 and Fg2 in the memory cells can be read out to a node Vout1 by a readout circuit 1.

Taking the memory cell Cell-A for example, it is composed of one PMOS with a floating gate, a control gate VCG1 capacitively coupling to the floating gate through a capacitor Ccg, and a control gate VPP1 capacitively coupling to the floating gate through a capacitor Ctun, and a source and drain of the PMOS are connected to VS1 and VD1, respectively, to connect to the readout circuit 1. An oxide film of the capacitor Ctun 401 is a tunnel oxide film for injecting and extracting charges, and writing operation is performed by Fowler-Nordheim current.

In the case of the memory cell Cell-A, the voltage value of the floating gate Fg1 is expressed as: (Vpp1×Ctun+Vcg1×Ccg+Q)/(Ccg+Ctun+Cox), wherein Q is an amount of charges of the floating gate Fg1. The readout circuit 1 is connected to VD1 and VS1, and reads out a voltage value of the floating gate of the memory cell in which the voltage value of the floating gate of either PMOS of memory cell Cell-A or Cell-B exceeds a threshold value of the PMOS. Vout1 and a write target value Vin1 are inputted to a comparator which outputs a write end signal, for example "0", to a node 410 when Vout1 becomes equal to the write target value Vin1. A write voltage controlling circuit outputs a writing voltage during writing operation, and outputs a write end voltage when the write end signal is inputted.

(Initial Condition of Writing Operation)

The initial condition of the floating gates before writing operation is executed is performed by setting control gates VCG1 and VCG2 to 0V and both of the floating gates Fg1 and Fg2 to 0V when VPP1 and VPP2 are set to 7V.

(Writing Operation)

Next, an example of writing operation of the memory cell Cell-A will be explained. When control gate VPP1 is a writing voltage, the control gate VCG1 is set to a reference voltage, for example 0V, and a voltage is set to the control gate VCG2 which voltage satisfies a condition in which, when VCG2 is applied, floating gate Fg2 does not cause the PMOS transistor to turn ON, and also another condition in which a enough Fowler-Nordheim current corresponding to a writing current does not flow in the oxide film with capacitor Ctun to which a voltage difference of floating gate Fg2 and the writing voltage of VPP1 is applied.

When writing operation is performed, firstly, a write target voltage is inputted to Vin1 as a value to be stored in the memory cell Cell-A. In order to select a memory cell to be stored, the control gate VCG1 of the memory cell Cell-A to be selected is set to 0V, and the control gate VCG2 of the unselected memory cell Cell-B is set to, for example, 13V. At this point, the potential of the floating gate Fg1 of the memory cell Cell-A to be selected is writing initial condition 0V, and the potential of the floating gate Fg2 of the unselected memory cell Cell-B is pulled up by (VCG2×Ccg)/(Ccg+Ctun+Cox) from 0V of the initial condition. In this condition, the write target voltage is written to the memory cell Cell-A by applying a writing voltage 18V to VPP1 to extract minus charges. During this writing operation, the voltage value of the floating gate Fg1 is outputted to a node 104 by the readout circuit. In the unselected memory cell Cell-B, as the potential of the floating gate Fg2 is pulled up by VCG2, the voltage applied to the oxide film with the capacitor Ctun is made low, thereby the adequate Fowler-Nordheim current corresponding to the writing current is prevented to flow. Similarly, as the potential of the floating gate Fg2 is pulled up over the threshold value of the PMOS transistor, the potential of the floating gate Fg2 is not outputted to the node 104, which has no effect on reading operation of the floating gate Fg1 to the node 104.

The termination of writing operation to the memory cell is performed such that, when the write target value becomes equal to the readout voltage value in the comparator, the end judgment is executed to output "0" to the node 410 as the write end signal and to set VPP1 to 7.0V of the write end voltage.

(Reading Operation)

The control gate VCG1 of the memory cell Cell-A to be selected is set to 0V, and the control gate VCG2 of the unselected memory cell Cell-B is set to 13V which causes the transistor of the unselected memory cell Cell-B to be OFF. This causes the readout circuit to output the value stored in the floating gate Fg1 of the memory cell Cell-A to the node 104, and as the potential of the floating gate Fg2 of the memory cell Cell-B has been pulled up to VCG2 over the threshold value of the PMOS transistor, the potential of the floating gate Fg2 is not outputted to the node 104, thereby not affecting on reading operation of the floating gate Fg1 to the node 104.

As described above, the embodiment can eliminate one transistor from a conventional method in which a transistor is provided to select a memory cell, and realize writing and reading of a selected memory cell, while keeping selectivity of memory cells, by handling the potential of the floating gate using control gates.

By employing this semiconductor memory device, in the method in which the condition of the memory cell is read out and at the same time compared during writing operation, one memory cell can be composed of one transistor and a capacitor, allowing the memory cell to be highly integrated.

Industrial Availability

As discussed above, according to the present invention, a semiconductor memory device can be obtained which can perform writing of analog and many-valued data to a memory cell at high speed and with a high degree of accuracy.

According to the invention relating to claims 9 to 11, a semiconductor memory device with high reliability with respect to writing and reading of analog and many-valued data to a memory cell can be obtained.

According to the invention, a semiconductor memory device can be obtained which can constitute a memory cell storing analog and many-valued data by one MOS transistor, allowing the memory cell to be highly integrated.

What is claimed is:

1. A semiconductor memory device comprising: a memory cell in which analog and many-valued signals can be written and stored; a readout circuit having an output terminal which outputs the values stored in said memory cell to the outside as voltages; a comparator having an output terminal which outputs a write end signal when said output terminal voltage of said readout circuit equals to a predetermined voltage; a write voltage controlling circuit having an output terminal which outputs an output voltage corresponding to said analog and many-valued voltage values inputted to an input terminal as a writing voltage of said memory cell; and a write voltage switching circuit having a function which supplies said output voltage of said write voltage controlling circuit to said memory cell and stops to supply said output voltage of said write voltage controlling circuit to said memory cell when said write end signal is outputted to the output terminal of said comparator.

2. The semiconductor memory device according to claim 1, wherein said memory cell is a nonvolatile memory with a floating gate structure composing of more than one MOS transistor and uses at least one of a Fowler-Nordheim current, a Channel-Hot-Electron current, or a Frankel-Poole emission current for writing.

3. The semiconductor memory device according to claim 1, wherein said writing voltage is made by adding said analog and many-valued signal to a constant voltage.

4. The semiconductor memory device according to claim 1, wherein said write voltage controlling circuit includes a means to select two or more specific voltages supplied from the outside of said write voltage controlling circuit depending on the voltage of said analog and many-valued signal to supply to said memory cell.

5. The semiconductor memory device according to claim 4, wherein said means to select two or more specific voltages is provided with an A/D converter and uses signals acquired by A/D conversion of said analog and many-valued signal.

6. The semiconductor memory device according to claim 1, wherein said write voltage controlling circuit includes a voltage conversion circuit having input-output characteristics described with a predetermined function, the voltage value of said analog and many-valued signal is inputted to said voltage conversion circuit, and the output of said voltage conversion circuit is outputted to said voltage controlling circuit.

7. A semiconductor memory device comprising: a memory cell in which analog and many-valued signals can be written and stored; a readout circuit having an output terminal which outputs said values stored in said memory cell to the outside as voltages; a comparison calculation circuit having an output terminal which outputs a write end signal when said output terminal voltage of said readout circuit equals to a predetermined voltage; a comparator having a means for inputting a voltage produced by adding a difference of said readout voltage of said output terminal and a standard voltage to a write target voltage to said predetermined voltage of said comparison calculation circuit; a write voltage controlling circuit having an output terminal which outputs a voltage for writing in said memory cell; and a write voltage switching circuit having a function which supplies said output voltage of said write voltage controlling circuit to said memory cell and stops to supply said output voltage of said write voltage controlling circuit to said memory cell when said write end signal is outputted to said output terminal of said comparator, and wherein writing operation is performed by executing a first writing in said memory cell by inputting said standard voltage to said predetermined voltage, and by inputting the voltage obtained by adding said difference of said readout voltage outputted on said output terminal of said readout circuit and said standard voltage to said write target voltage to the predetermined voltage of said comparison calculation circuit, immediately after the end of said first writing, as a second writing to said memory cell to which said first writing has been performed.

8. The semiconductor memory device according to claim 7, wherein said write target voltage is used as said standard voltage.

9. A semiconductor memory device comprising two or more memory devices, one of which comprising: a floating gate in which analog and many-valued signals can be written and stored and further said analog and many-valued signals can be stored as an amount of charges; a memory cell having a control gate which performs capacitive coupling with said floating gate; a readout circuit having an output terminal which outputs the values stored in said memory cell to the outside as voltages; a comparator having an output terminal which outputs a write end signal when said output terminal voltage of said readout circuit equals to a predetermined voltage; and a write voltage controlling circuit having an output terminal and a means for outputting which output a voltage for writing in said memory cell and also including a function which stops to supply said writing voltage of said output terminal to said memory cell when said write end signal is outputted to said output terminal of said comparator, and further, comprising a operational amplifier which includes a plus input terminal and a minus input terminal and amplifies the difference of voltage values of said plus input terminal and said minus input terminal to output as a voltage; and a control gate controlling circuit which is provided with a means for connecting said output of said operational amplifier to both of control gates of a first and a second memory devices, and wherein writing to said first memory device is performed by inputting a standard voltage to said predetermined voltage of said first memory device and by setting said control gate of said memory cell of said first memory device to a reference voltage, writing to said second memory device is executed by causing said control gate of said memory cell of said second memory device to be a reference voltage and by inputting a write target voltage to said predetermined voltage, and when the value stored in said memory cell of said second memory device is read out, the readout operation is performed with high precision by connecting an output of said output terminal of said readout circuit of said first memory device to said minus terminal of said operational amplifier, by connecting said standard voltage to said plus terminal of said operational amplifier, and by connecting said output of said operational amplifier to said control gates of said first and second memory devices.

10. A semiconductor memory device comprising two or more memory devices, one of which comprising: a floating gate in which analog and many-valued signals can be written and stored and further said analog and many-valued signals can be stored as an amount of charges; a memory cell having a control gate which perform capacitive coupling with said floating gate; a readout circuit having an output terminal which outputs said values stored in said memory cell to the outside as voltages; a comparator having an output terminal which outputs a write end signal when said output terminal voltage of said readout circuit equals to a predetermined voltage; and a write voltage controlling circuit having an output terminal which outputs voltage for writing in said memory cell and a means for outputting, and also including a function which stops to supply said voltage for writing of said output terminal to said memory cell when said write end signal is outputted to said output terminal of said comparator, and further, comprising a operational amplifier which includes a plus input terminal and a minus input terminal and amplifies the difference of voltage values of said plus input terminal and said minus input terminal to output as a voltage; and a control gate controlling circuit which is provided with a means for connecting said output of said operational amplifier to both of control gates of a first memory device and a second memory device, and wherein, after writing to said first memory device has been performed by inputting a standard voltage to said predetermined voltage of said first memory device and by causing said control gate of said memory cell of said first memory device to be a reference voltage, writing operation is performed by connecting an output of said output terminal of said readout circuit of said first memory device to said minus terminal of said operational amplifier, by connecting said standard voltage to said plus terminal of said operational amplifier, by connecting said output of said operational amplifier to said control gates of said first and second memory devices, and by inputting a write target voltage to said predetermined voltage of said second memory device.

11. The semiconductor memory device according to claim 9, wherein said memory cells of said first and second memory devices are nonvolatile memories with floating gate structure composing of more than one MOS transistor and use one of a Fowler-Nordheim current, a Channel-Hot-Electron current, or a Frankel-Poole emission current for writing.

12. A semiconductor memory device which has a plurality of memory cells including MOS transistors with floating gates, control gates performing first capacitive coupling with said floating gates, and write terminals performing second capacitive coupling with said floating gates and capable of writing and storing analog and many-valued signals, and has a readout circuit capable of writing to a selected memory cell and outputting a voltage of said floating gate of said selected memory cell to an output terminal, wherein the selection of a memory cell is performed by voltage control of said control gate coupling to said floating gate of said selected memory cell and in writing operation to said selected memory cell, the voltage of said floating gate is outputted to said output terminal using said readout circuit simultaneous with writing, and termination judgment for writing is executed depending on said output voltage of said output terminal to terminate the writing operation.

13. The semiconductor memory device according to claim 12, wherein said second capacitive coupling is performed using a tunnel oxide film and said writing is performed using a Fowler-Nordheim current.

14. The semiconductor memory device according to claim 2, wherein said writing voltage is made by adding said analog and many-valued signal to a constant voltage.

15. The semiconductor memory device according to claim 2, wherein said write voltage controlling circuit includes a means to select two or more specific voltages supplied from the outside of said write voltage controlling circuit depending on the voltage of said analog and many-valued signal to supply to said memory cell.

16. The semiconductor memory device according to claim 2, wherein said write voltage controlling circuit includes a voltage conversion circuit having input-output characteristics described with a predetermined function, the voltage value of said analog and many-valued signal is inputted to said voltage conversion circuit, and the output of said voltage conversion circuit is outputted to said voltage controlling circuit.

17. The semiconductor memory device according to claim 10, wherein said memory cells of said first and second memory devices are nonvolatile memories with floating gate structure composing of more than one MOS transistor and use one of a Fowler-Nordheim current, a Channel-Hot-Electron current, or a Frankel-Poole emission current for writing.

* * * * *